United States Patent
Hamade et al.

(10) Patent No.: US 11,644,679 B2
(45) Date of Patent: May 9, 2023

(54) IMAGE LIGHT GENERATION DEVICE AND IMAGE DISPLAY DEVICE

(71) Applicant: SEIKO EPSON CORPORATION, Tokyo (JP)

(72) Inventors: Yuiga Hamade, Matsumoto (JP); Takumi Kodama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 163 days.

(21) Appl. No.: 17/384,813

(22) Filed: Jul. 26, 2021

(65) Prior Publication Data
US 2022/0026726 A1    Jan. 27, 2022

(30) Foreign Application Priority Data

Jul. 27, 2020   (JP) .............................. JP2020-126766

(51) Int. Cl.
G02B 27/12     (2006.01)
H10K 59/121    (2023.01)
H01L 27/12     (2006.01)

(52) U.S. Cl.
CPC ................................ *G02B 27/126* (2013.01); *H10K 59/1213* (2023.02); *H01L 27/1222* (2013.01); *H01L 27/1237* (2013.01)

(58) Field of Classification Search
CPC .......................... G02B 27/126; G02B 27/102; G02B 27/0172; H01L 27/3262; H01L 27/1222; H01L 27/1237; H01L 27/3211; H01L 51/5275; G09G 3/3225
See application file for complete search history.

(56) References Cited

U.S. PATENT DOCUMENTS

2010/0103078 A1\* 4/2010 Mukawa ............ G02B 27/0176
345/8

FOREIGN PATENT DOCUMENTS

| JP | 2000275732 |   | 10/2000 |              |
|----|------------|---|---------|--------------|
| JP | 2008256827 |   | 10/2008 |              |
| JP | 2020012970 | A * | 1/2020 | ......... G02B 27/0172 |

\* cited by examiner

*Primary Examiner* — Anne M Hines
*Assistant Examiner* — Jose M Diaz
(74) *Attorney, Agent, or Firm* — JCIPRNET

(57) ABSTRACT

An image light generation device includes a first panel configured to emit a first image light including a blue wavelength region, a second panel configured to emit a second image light including a wavelength region different from the blue wavelength region, and a color combining prism configured to combine the first image light and the second image light. The first panel includes a plurality of first pixels, each of the plurality of first pixels includes a first light emitting element, and a first transistor provided corresponding to the first light emitting element, the second panel includes a plurality of second pixels, each of the plurality of second pixels includes a second light emitting element, and a second transistor provided corresponding to the second light emitting element, and a size of the first transistor is greater than a size of the second transistor.

9 Claims, 9 Drawing Sheets

IMAGE LIGHT GENERATION DEVICE AND IMAGE DISPLAY DEVICE

The present application is based on, and claims priority from JP Application Serial Number 2020-126766, filed Jul. 27, 2020, the disclosure of which is hereby incorporated by reference herein in its entirety.

BACKGROUND

1. Technical Field

The present disclosure relates to an image light generation device and an image display device.

2. Related Art

Image light generation devices including a plurality of panels that emit color light different from each other and a color combining device that combines the color light emitted from the plurality of panels are conventionally known. One example of such panels is an organic electroluminescence (EL) panel. This type of image light generation device has been used in image display devices such as head-mounted displays and projectors.

JP-A-2008-256827 discloses an organic EL light emission panel including a plurality of pixel circuits. Each of the plurality of pixel circuits includes a plurality of light emitting elements that emit light of a plurality of colors different from each other, and a driving transistor that supplies a driving current to a first electrode of the light emitting element. In addition, JP-A-2008-256827 discloses that a power source supply means supplies a first potential to the source of the driving transistor and a second potential to a second electrode of the light emitting element, and the second potential is adjusted in accordance with the temperature detected by a temperature detection means, and thus, the power consumption is reduced.

In general, in light emitting elements of a charge injection type such as an organic EL element, a light emitting element that emits blue light among light emitting elements having emission colors different from each other has a larger energy gap of the semiconductor material than light emitting elements that emit other color light. Therefore, to increase the luminance of the blue light, it is necessary to increase the drive voltage. In addition, the light emitting element that emits blue light has a lower light emission efficiency than the light emitting elements that emit other color light, and from this point of view as well, it is necessary to increase the drive voltage. However, when a high drive voltage is supplied to the light emitting element, the breakdown voltage of the transistor for driving the light emitting element may become insufficient, and the reliability of the transistor may be reduced. On the other hand, when the breakdown voltage of the transistor of the panel of each color is set to a high breakdown voltage in order to suppress the reduction of the reliability of the transistor, the power consumption of the image display device may be increased.

It is to be noted that the technique disclosed in JP-A-2008-256827 is intended to achieve a low power consumption by setting the second potential in accordance with the difference in the temperature characteristics of a plurality of the light emitting elements when the temperature change is caused in the light emitting elements. Therefore, there is no disclosure or suggestion of a means to solve the above-mentioned problems in JP-A-2008-256827.

SUMMARY

To solve the above-mentioned problems, an image light generation device according to one aspect image of the present disclosure includes a first panel configured to emit a first image light including a blue wavelength region, a second panel configured to emit a second image light including a wavelength region different from the blue wavelength region, and a color combining prism configured to combine the first image light and the second image light. The first panel includes a plurality of first pixels, each of the plurality of first pixels includes a first light emitting element configured to emit color light including the blue wavelength region, and a first transistor provided corresponding to the first light emitting element, the second panel includes a plurality of second pixels, each of the plurality of second pixels includes a second light emitting element configured to emit color light including a wavelength region different from the blue wavelength region, and a second transistor provided corresponding to the second light emitting element, and a size of the first transistor is greater than a size of the second transistor.

An image light generation device according to another aspect image of the present disclosure includes a first panel configured to emit a first image light including a first wavelength region, a second panel configured to emit a second image light including a wavelength region different from the first wavelength region, and a color combining prism configured to combine the first image light and the second image light. The first panel includes a plurality of first pixels, each of the plurality of first pixels includes a first light emitting element configured to emit color light including the first wavelength region, and a first transistor provided corresponding to the first light emitting element, the first light emitting element includes a tandem structure including a light emitting layer, the second panel includes a plurality of second pixels, each of the plurality of second pixels includes a second light emitting element configured to emit color light including a wavelength region different from the first wavelength region, and a second transistor provided corresponding to the second light emitting element, and a size of the first transistor is greater than a size of the second transistor.

An image display device according to one aspect image of the present disclosure includes the image light generation device.

DESCRIPTION OF EXEMPLARY EMBODIMENTS

First Embodiment

A first embodiment of the present disclosure is described below with reference to FIG. 1 to FIG. 6.

Figure 1:
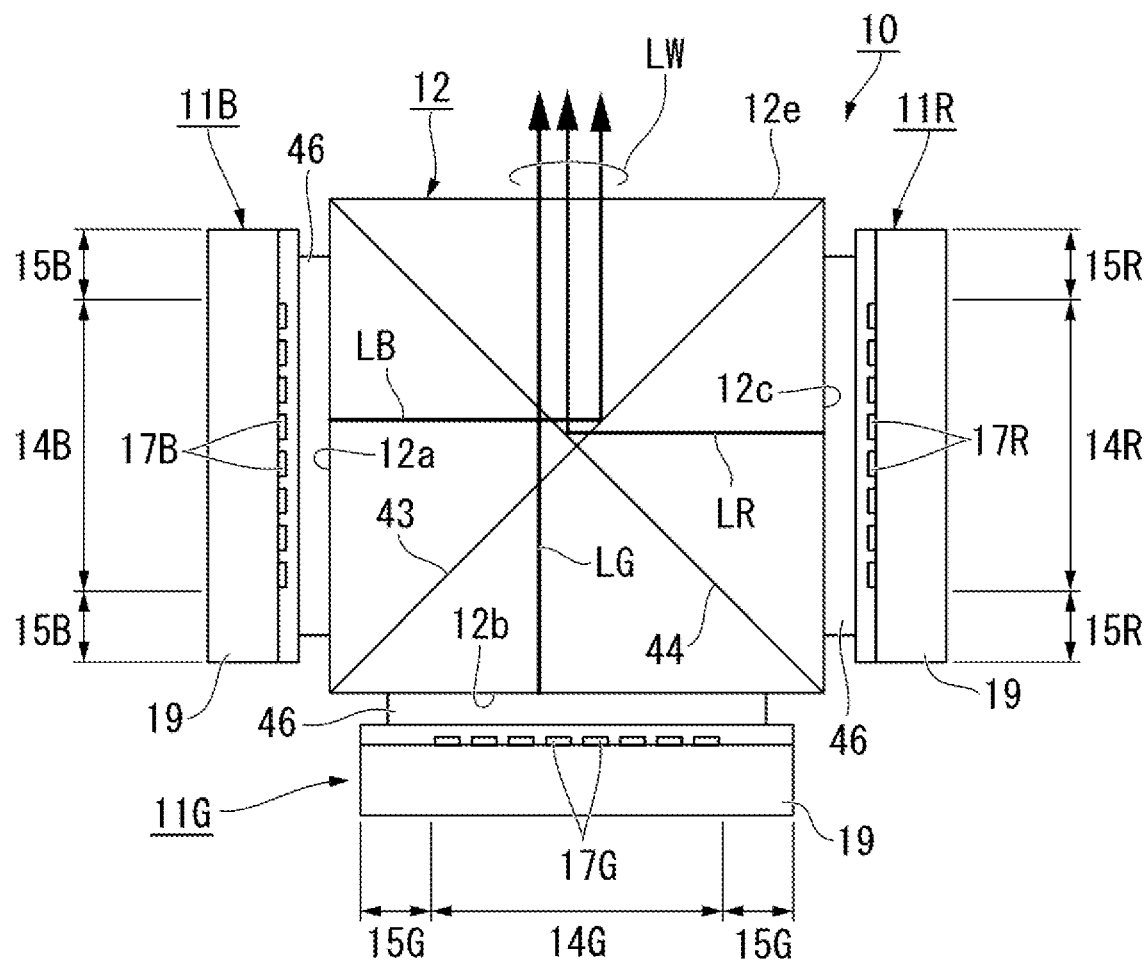
FIG. 1 is a diagram illustrating a schematic configuration of an image light generation module of a first embodiment.

FIG. 1 is a diagram illustrating a schematic configuration of an image light generation device of the first embodiment.

It is to be noted that in each drawing described below, components may not be drawn to scale for the sake of clarity of the components.

An image light generation device 10 of the present embodiment uses three self-emitting panels composed of an organic electroluminescence (EL) panels, as image light generation panels.

As illustrated in FIG. 1, the image light generation device 10 includes a first panel 11B, a second panel 11G, a third panel 11R, and a dichroic prism 12 (color combining prism).

The first panel 11B includes a first pixel region 14B including a plurality of pixels disposed in a matrix and a first non-pixel region 15B that surrounds the periphery of the first pixel region 14B. The second panel 11G includes a second pixel region 14G including a plurality of pixels disposed in a matrix and a second non-pixel region 15G that surrounds the periphery of the second pixel region 14G. The third panel 11R includes a third pixel region 14R including a plurality of pixels disposed in a matrix and a third non-pixel region 15R that surrounds the periphery of the third pixel region 14R.

Each of the plurality of pixels in the first panel 11B is provided with a first light emitting element 17B. Each of the plurality of pixels in the second panel 11G is provided with a second light emitting element 17G. Each of the plurality of pixels in the third panel 11R is provided with a third light emitting element 17R.

Each of a plurality of the first light emitting elements 17B provided in the first pixel region 14B of the first panel 11B emits blue first image light LB. In addition, each of a plurality of the second light emitting elements 17G provided in the second pixel region 14G of the second panel 11G emits green second image light LG. In addition, each of a plurality of the third light emitting elements 17R provided in the third pixel region 14R of the third panel 11R emits red third image light LR. In the present embodiment, each of the first light emitting element 17B, the second light emitting element 17G, and the third light emitting element 17R is composed of a top-emission organic EL element. That is, each of the first panel 11B, the second panel 11G, and the third panel 11R is composed of an organic EL panel.

As illustrated in FIG. 1, the first panel 11B emits a first image light LB of the blue wavelength region. Accordingly, the image light emitted from the first panel 11B impinges on the dichroic prism 12 as the first image light LB of the blue wavelength region. The second panel 11G emits a second image light LG of the green wavelength region. Accordingly, the image light emitted from the second panel 11G impinges on the dichroic prism 12 as the second image light LG of the green wavelength region. The third panel 11R emits a third image light LR of the red wavelength region. Accordingly, the image light emitted from the third panel 11R impinges on the dichroic prism 12 as the third image light LR of the red wavelength region.

The peak wavelength of the blue wavelength region is, for example, from 450 nm to 490 nm. The peak wavelength of the green wavelength region is, for example, from 495 nm to 570 nm. The peak wavelength of the red wavelength region is, for example, from 610 nm to 680 nm. Each of the first image light LB, the second image light LG, and the third image light LR does not have polarization properties. That is, each of the first image light LB, the second image light LG, and the third image light LR is unpolarized light with no specific vibration direction. It is to be noted that unpolarized light, i.e., light with no polarization properties, is light of a not completely unpolarized state that contains some polarization components, but has a polarization level, such as a polarization level of 20% or less, within a range that is considered not to positively affect the optical performance for optical components such as dichroic mirrors, for example.

The dichroic prism 12 is composed of an optically transparent member having a quadrangular prism shape. In addition, the optically transparent member having a quadrangular prism shape is composed of a combination of four triangular prismatic optically transparent members. The dichroic prism 12 includes a first incidence surface 12a, a third incidence surface 12c opposite the first incidence surface 12a, a second incidence surface 12b in perpendicular contact with the first incidence surface 12a and the third incidence surface 12c, and an emission surface 12e opposite the second incidence surface 12b.

The dichroic prism 12 includes a first dichroic mirror 43 that does not have a polarization separation property, and a second dichroic mirror 44 that does not have a polarization separation property. The first dichroic mirror 43 and the second dichroic mirror 44 intersect each other at an angle of 90°. The first dichroic mirror 43 has a property of reflecting the first image light LB and transmitting the second image light LG and the third image light LR. The second dichroic mirror 44 has a property of reflecting the third image light LR and transmitting the first image light LB and the second image light LG.

The first panel 11B is disposed opposite to the first incidence surface 12a. The second panel 11G is disposed opposite to the second incidence surface 12b. The third panel 11R is disposed opposite to the third incidence surface 12c. In the present embodiment, the first panel 11B is fixed to the first incidence surface 12a through an optically transparent adhesive agent layer 46. The second panel 11G is fixed to the second incidence surface 12b through the optically transparent adhesive agent layer 46. The third panel 11R is fixed to the third incidence surface 12c through the optically transparent adhesive agent layer 46.

The image light generation device 10 of the present embodiment emits composite image light LW composed of a combination of the first image light LB, the second image light LG, and the third image light LR, from the emission surface 12e of the dichroic prism 12.

Figure 2:
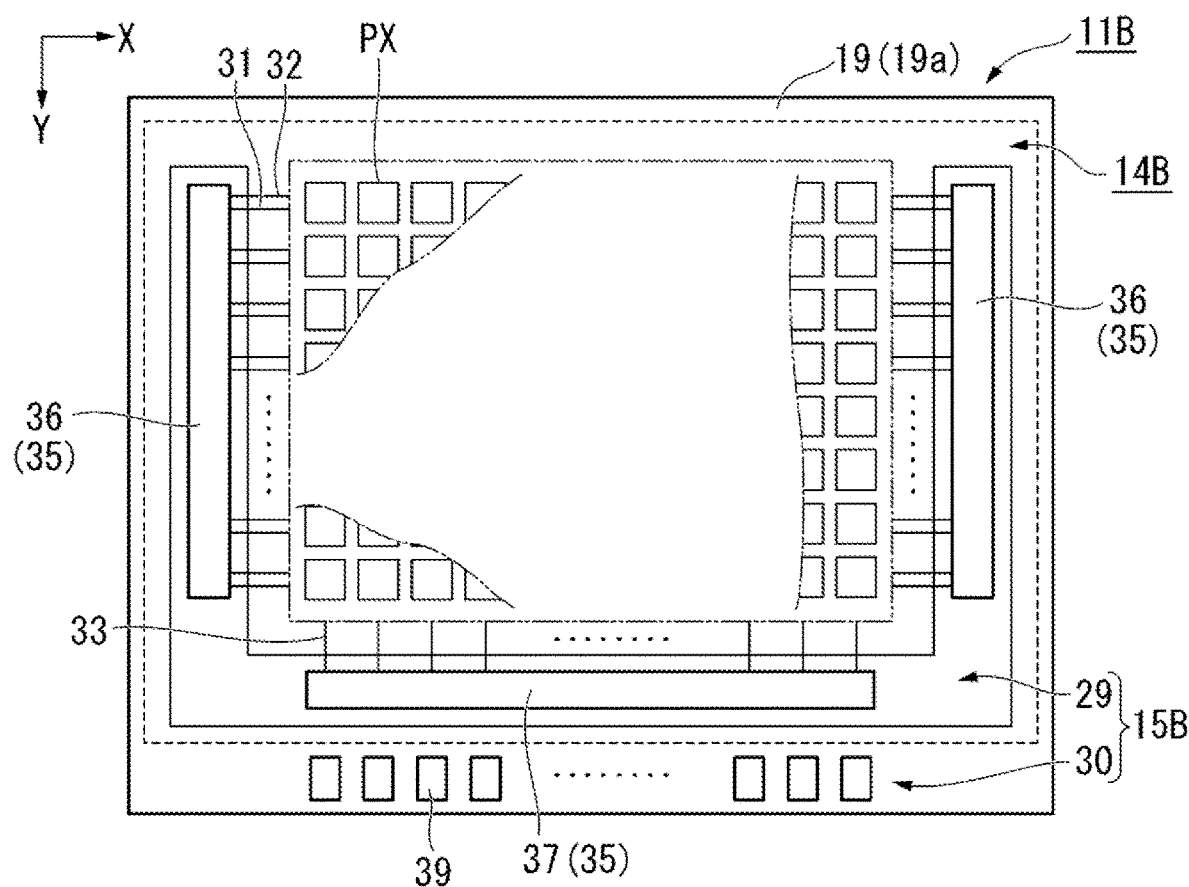
FIG. 2 is a diagram illustrating a schematic configuration of a first panel.

FIG. 2 is a schematic configuration diagram illustrating a general configuration of the first panel 11B.

Regarding the general configuration of the panel, the first panel 11B, the second panel 11G, and the third panel 11R have a common basic configuration, and therefore, the general configuration of the panel is described below with the first panel 11B as a representative.

In FIG. 2, the horizontal direction of the first panel 11B is the X direction, and the vertical direction of the first panel 11B is the Y direction.

As illustrated in FIG. 2, the first pixel region 14B and the first non-pixel region 15B are provided in a first surface 19a of a substrate 19. In addition, the first non-pixel region 15B is composed of a peripheral region 29 and a mounting region 30. The first pixel region 14B is a rectangular region where a plurality of first pixels PX is disposed in a matrix. In the first pixel region 14B, a plurality of scan lines 31 extending in the X direction, a plurality of control lines 32 extending in the X direction in association with the scan lines 31, and a plurality of data lines 33 extending in the Y direction, which intersects the X direction. A pixel PX is a region corresponding to each intersection of the plurality of scan lines 31 and the plurality of data lines 33. Thus, a plurality of the pixels PX is arranged in a matrix over the X direction and the Y direction. The pixel PX includes a pixel circuit 110 described later.

In terms of the structure, the pixel PX includes multiple pairs of components from the anode to the cathode that correspond to a plurality of light emitting elements that are turned on or off in accordance with the image data for one pixel in the display image. In addition, in terms of the display, the pixel PX corresponds to the display region that is turned on or off in accordance with the image data for one pixel in the display image.

Each of the plurality of first pixels PX includes a first light emitting element that emits blue light, and a plurality of first transistors that drives the first light emitting element. Details of the configurations of the first light emitting element and the first transistor will be elaborated later.

In addition, the second panel 11G (not illustrated) includes a plurality of second pixels. Each of the plurality of second pixels includes a second light emitting element that emits green light, and a plurality of second transistors that drives the second light emitting element. That is, the second pixel includes the second light emitting element that emits color light other than blue light, and the plurality of second transistors that drives the second light emitting element. The third panel 11R (not illustrated) includes a plurality of third pixels. Each of the plurality of third pixels includes a third light emitting element that emits red light, and a plurality of third transistors that drives the third light emitting element. That is, the third pixel includes the third light emitting element that emits color light other than blue light, and the plurality of third transistors that drives the third light emitting element.

The peripheral region 29 is a region having a rectangular frame shape that surrounds the first pixel region 14B. A driving circuit 35 is provided in the peripheral region 29. The driving circuit 35 is a circuit that drives each first pixel PX in the first pixel region 14B. The driving circuit 35 includes two scan line driving circuits 36 and a data line driving circuit 37. The first panel 11B is a panel with a built-in circuit in which the driving circuit 35 is composed of an active device such as a transistor formed on the first surface 19a of the substrate 19.

The mounting region 30 is provided on the side opposite to the first pixel region 14B with respect to the peripheral region 29, that is, outside the peripheral region 29. A plurality of mounting terminals 39 is provided in the mounting region 30. Control signals and power-source potentials are supplied to the mounting terminal 39 from various external circuits (not illustrated) including control circuits and power supply circuits. The external circuit is mounted on a flexible printed wiring substrate (not illustrated) joined to the mounting region 30, for example.

The pixel circuit 110 is described below with reference to FIG. 3.

Figure 3:
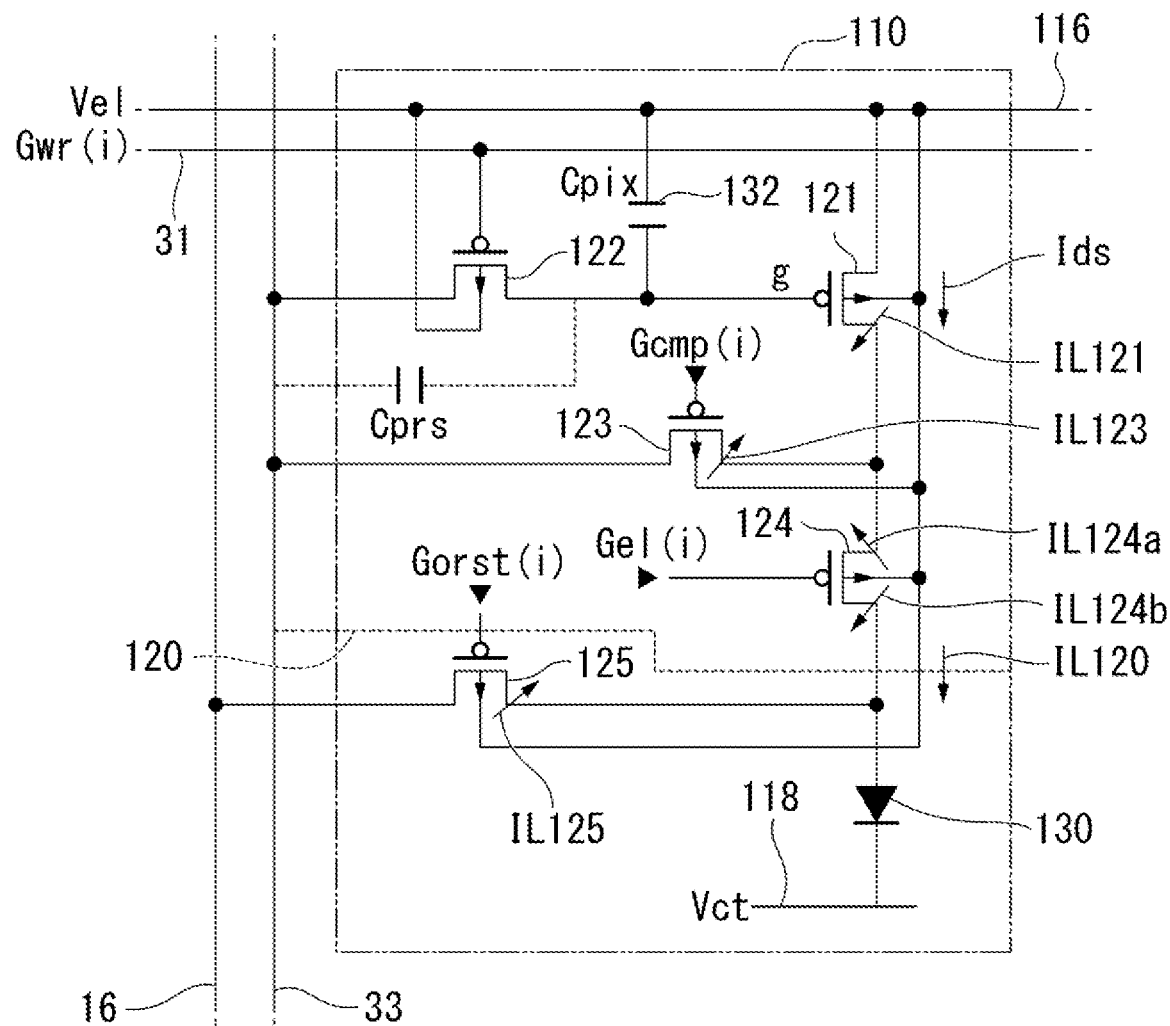
FIG. 3 is an equivalent circuit diagram illustrating a configuration of a pixel circuit.

FIG. 3 is an equivalent circuit diagram illustrating a configuration of the pixel circuit 110.

A plurality of the pixel circuits 110 have the same electrical configuration, and here, the pixel circuit 110 of the ith row and the jth column is described as an example.

It is to be noted that the i is a symbol that generally indicates the row in which the pixel circuit 110 is arranged, and is an integer from 1 to m. The j is a symbol that generally indicates the column in which the pixel circuit 110 is arranged, and is an integer from 1 to n.

As illustrated in FIG. 3, the pixel circuit 110 includes P-channel MOS type transistors 121 to 125, a light emitting element 130, and a capacitor 132. A scanning signal Gwr (i), and control signals Gel (i), Gcmp (i), and Gorst (i) are supplied to the pixel circuit 110. Here, the scanning signal Gwr (i), and the control signals Gel (i), Gcmp (i), and Gorst (i) are supplied from the scan line driving circuit 36 to the pixel circuit 110 of the ith row. That is, the scanning signal Gwr (i), and the control signals Gel (i), Gcmp (i), and Gorst (i) are supplied also to pixel circuits of columns other than the jth column in the ith row in a common manner.

In the pixel circuit 110 of the ith row and the jth column, the gate node of the transistor 122 is coupled with a scan line 31 of the ith row, one of the drain node or the source node thereof is coupled with a data line 33 of the jth column, and the other of the drain node or the source node thereof is coupled with the gate node g of the transistor 121, one end of the capacitor 132, and the drain node of the transistor 123. The transistor 122 functions as a current value setting transistor that sets the current value of the transistor 121 by supplying a data signal output to the data line 33 to the gate node of transistor 121. Here, the gate node of the transistor 121 is denoted as g to distinguish it from other nodes.

The transistor 121 functions as a driving transistor that generates a driving current for the light emitting element 130. The source node of the transistor 121 is coupled with a power supply line 116, and the drain node thereof is coupled with the source node of the transistor 123 and the source node of the transistor 124. Here, a potential Vel, which is the high side of the power source in the pixel circuit 110, is supplied to the power supply line 116.

The transistor 123 functions as a compensating transistor for compensating for the threshold voltage of the transistor 121. The drain node of the transistor 123 is coupled with the data line 33. The control signal Gcmp (i) is supplied to the gate node of the transistor 123.

The control signal Gel (i) is supplied to the gate node of the transistor 124, and the drain node of the transistor 124 is coupled with the source node of the transistor 125 and the anode of the light emitting element 130. The transistor 124, which is provided in a current path for a driving current supplied to the light emitting element 130, functions as a light emission control transistor that controls the light emission period of the light emitting element 130. To be more specific, the transistor 124 is turned on when the light emitting element 130 is to emit light, and the transistor 124 is turned off when the light emitting element 130 is not to emit light.

The transistors 121 to 124 described above constitute a transistor circuit 120 that supplies a driving current to the light emitting element 130.

The control signal Gorst (i) corresponding to the ith row is supplied to the gate node of the transistor 125, and the drain node of the transistor 125 is coupled with a power supply line 16 corresponding to the jth column and maintained at potential Vorst. The transistor 125 functions as an electrostatic discharge transistor that turns on when the light emitting element 130 is not emitting light so as to couple the anode of the light emitting element 130 to the power supply line 16.

The other end of the capacitor 132 is coupled with the power supply line 116. Thus, the capacitor 132 holds the voltage between the source and drain of the transistor 121. It is to be noted that as the capacitor 132, a capacitance parasitic on the gate node g of the transistor 121 may be used, or a capacitance formed by sandwiching an insulation layer between conductive layers different from each other in a silicon substrate may be used.

In the present embodiment, each of the transistors 121 to 125 is formed on a semiconductor substrate of silicon or the like, and therefore the substrate potential (n-well potential) of the transistors 121 to 125 is set at the potential Vel, which is the high side of the power source. In addition, the anode of the light emitting element 130 is a pixel electrode individually provided for each pixel circuit 110. In contrast, the cathode of the light emitting element 130 is a common electrode 118 common to all of the pixel circuits 110, and is set at a potential Vct, which is the lower side of the power source in the pixel circuit 110.

Figure 4:
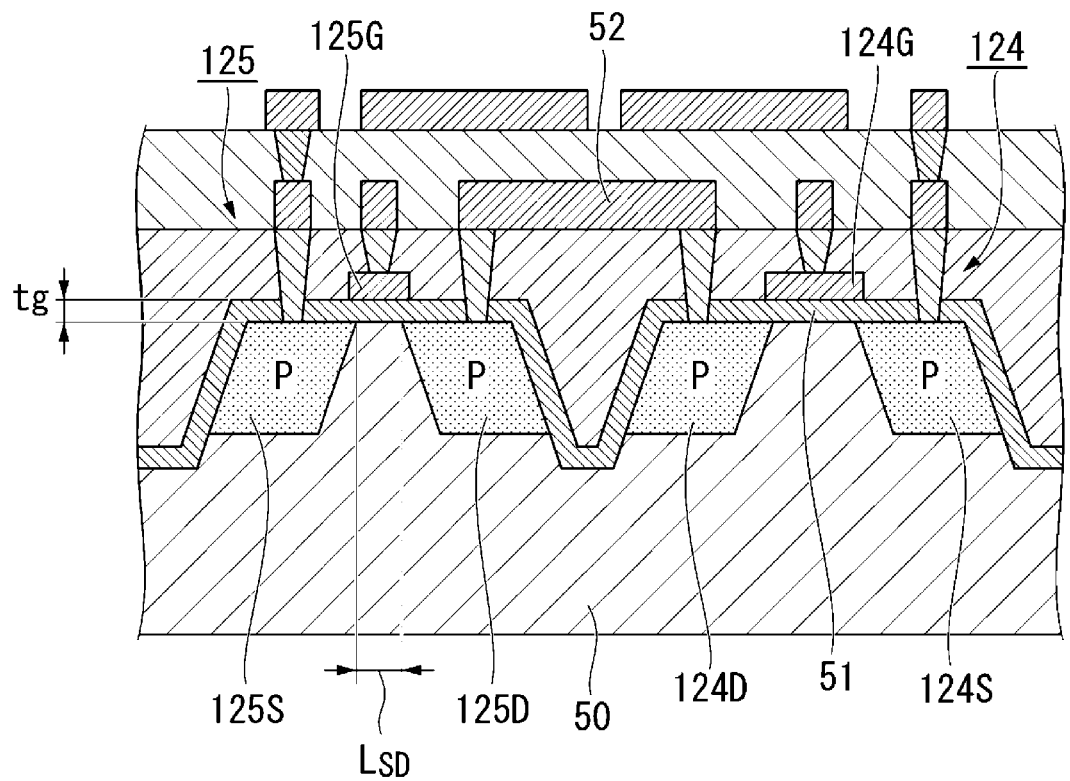
FIG. 4 is a sectional view illustrating each panel transistor.

FIG. 4 is a sectional view illustrating configurations of the transistor 124 and the transistor 125 in the above-mentioned pixel circuit. It is to be noted that while FIG. 4 illustrates only the transistor 124 and the transistor 125 of the above-mentioned five transistors, other transistors have the same configuration.

As illustrated in FIG. 4, the transistors 124 and 125 of the present embodiment have a shallow trench isolation (STI) structure for the purpose of suppressing a leakage current between transistors adjacent to each other. In addition, the transistors 124 and 125 are composed of PMOS transistors formed on an n-well region 50. Specifically, the transistor 124 includes a source 124S and a drain 124D in which p-type impurities are introduced, and a gate 124G provided on a gate insulating film 51. The transistor 125 includes a source 125S and a drain 125D in which p-type impurities are introduced, and a gate 125G provided on the gate insulating film 51. The drain 124D of the transistor 124 and the drain 125D of the transistor 125 are electrically connected through a wiring 52.

As described above, while the pixel circuits of the first panel 11B, the second panel 11G and the third panel 11R have the same configuration, the sizes of the transistors constituting the pixel circuits of the panels 11B, 11G and 11R are different from each other. To be more specific, the size of the first transistor constituting the pixel circuit of the first panel 11B is greater than the size of the second transistor constituting the pixel circuit of the second panel 11G, and the size of the third transistor constituting the pixel circuit of the third panel 11R.

To be more specific, the above-mentioned relationship between the sizes of the transistors includes any of the following configurations.

For one configuration, the distance between the source and the drain of each transistor is referred to as a source-drain distance $L_{SD}$. In this case, the source-drain distance LSD of the first transistor is greater than the source-drain distance $L_{SD}$ of the second transistor and the source-drain distance $L_{SD}$ of the third transistor. It is to be noted that the source-drain distance $L_{SD}$ of the second transistor and the source-drain distance $L_{SD}$ of the third transistor may be the same or may be different from each other.

In the five transistors constituting the pixel circuit in each of the panels 11B, 11G and 11R, the source-drain distances $L_{SD}$ of some transistors may be different from each other. For example, in the example illustrated in FIG. 4, the source-drain distance $L_{SD}$ of the transistor 124 and the source-drain distance $L_{SD}$ of the transistor 125 are different from each other. Even in this case, when all transistors of the same positions are compared with each other, the relationship, in which the source-drain distance $L_{SD}$ of the first transistor is greater than the source-drain distance $L_{SD}$ of the second transistor and the source-drain distance $L_{SD}$ of the third transistor, is satisfied.

In another configuration, the film thickness tg of the gate insulating film of the first transistor is greater than the film thickness tg of the gate insulating film of the second transistor and the film thickness tg of the gate insulating film of the third transistor. It is to be noted that the film thickness tg of the gate insulating film of the second transistor and the film thickness tg of the gate insulating film of the third transistor may be the same or may be different from each other.

In the five transistors constituting the pixel circuit in each of the panels 11B, 11G and 11R, the gate insulating film thicknesses tg of some transistors may be different from each other. Even in this case, when all transistors of the same positions are compared with each other, the relationship, in which the gate insulating film thickness tg of the first transistor is greater than the gate insulating film thickness tg of the second transistor and the gate insulating film thickness tg of the third transistor, is satisfied.

In addition, the relationship between the sizes of the transistors may include both the above-mentioned two configurations. Specifically, the source-drain distance $L_{SD}$ of the first transistor may be greater than the source-drain distance $L_{SD}$ of the second transistor and the source-drain distance $L_{SD}$ of the third transistor, with the film thickness tg of the gate insulating film of the first transistor greater than the film thickness tg of the gate insulating film of the second transistor and the film thickness tg of the gate insulating film of the third transistor.

Configurations of the light emitting elements 17R, 17G and 17B of the first panel 11B, the second panel 11G and the third panel 11R are described below.

It is to be noted that the first panel 11B, the second panel 11G and the third panel 11R have the same basic configuration of the panel while having different constituent materials of the light emitting layer composed of an organic EL material, the charge injection layer and the like. Accordingly, the basic configuration of the panel is described with the first panel 11B as a representative.

Figure 5:
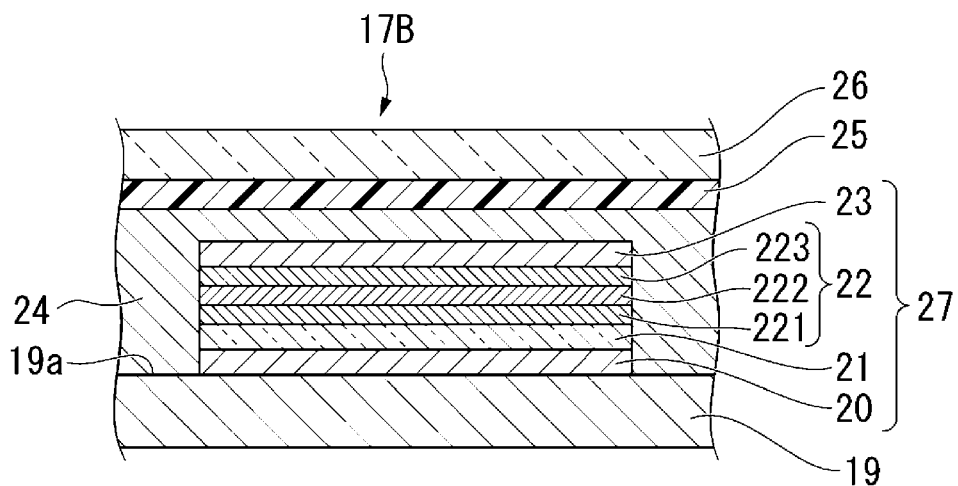
FIG. 5 is a sectional view illustrating a schematic configuration of a light emitting element.

FIG. 5 is a sectional view illustrating a schematic configuration of one first light emitting element 17B in the first panel 11B.

As illustrated in FIG. 5, the first light emitting element 17B includes the substrate 19, a reflection electrode 20, an anode 21, a light emission functional layer 22, a cathode 23, a sealing film 24, a color filter 25, and a cover glass 26. To be more specific, on the first surface 19a of the substrate 19, the reflection electrode 20, the anode 21, the light emission functional layer 22, and the cathode 23 are provided in this order from the substrate 19 side. The substrate 19 is composed of a semiconductor substrate of silicon or the like, for example. The reflection electrode 20 is composed of a conductive material having a light reflecting property containing aluminum, silver and the like, for example. To be more specific, the reflection electrode 20 may be composed of a single material such as aluminum, silver or the like, or may be composed of a laminated film of titanium (Ti)/AlCu (aluminum-copper alloy), for example.

The anode 21 is composed of an optically transparent conductive material such as indium tin oxide (ITO) and the like, for example. The light emission functional layer 22 is composed of a hole injection layer 221, a light emitting layer 222 including an organic EL material, and an electron injection layer 223 in this order from the anode 21 side. The light emitting layer 222 is composed of a known organic EL material corresponding to the emission color of each panel. It is to be noted that the light emitted by the light emitting layer 222 may be fluorescence or phosphorescence.

The cathode 23 functions as a semi-transmissive reflection layer having a property of transmitting a part of the light and reflecting the remaining light. The cathode 23 having a semi-transmissive reflectivity can be achieved by forming a conductive material having a light reflecting property such as an alloy containing silver and/or magnesium in a sufficiently small film thickness, for example. The components of a specific resonance wavelength in the light emitted from the light emitting layer 222 are selectively amplified while the light travels back and forth between the reflection electrode 20 and the cathode 23, and then the light is transmitted through the cathode 23 and emitted to the side opposite to the substrate 19. Specifically, a plurality of layers from the reflection electrode 20 to the cathode 23 constitutes a light resonator 27.

The plurality of layers from the reflection electrode 20 to the cathode 23 is covered with the sealing film 24. The sealing film 24 is a film for preventing entry of the external air and/or moisture, and is composed of an optically transparent inorganic material, or a single layer or a plurality of layers of an organic material.

The color filter 25 corresponding to the emission color is provided on one surface of the sealing film 24. In the first panel 11B, the color filter 25 is composed of a light absorbing filter layer that absorbs the light of the wavelength region other than the blue wavelength region and transmits the light of the blue wavelength region. In addition, the color filter 25 in the second panel 11G is composed of a light absorbing filter layer that absorbs the light of the wavelength region other than the green wavelength region and transmits the light of the green wavelength region. The color filter 25 in the third panel 11R is composed of a light absorbing filter layer that absorbs the light of the wavelength region other than the red wavelength region and transmits the light of the red wavelength region.

In the present embodiment, since each of the first panel 11B, the second panel 11G and the third panel 11R includes the light resonator 27, light corresponding to each color is emitted by the resonance of the light at the resonance wavelength. Further, since the color filter 25 is provided on the light emission side of the light resonator 27, the color purity of image light LB, LG and LR emitted from the panels 11B, 11G and 11R is further increased. It is to be noted that the color filter 25 may be omitted depending on the wavelength region of the light to be emitted from the light emitting layer 222.

The cover glass 26 for protecting each light emitting element is provided on one surface of the color filter 25.

As described above, the high side potential Vel of the power source is applied to the n-well region 50 that constitutes the channel of each transistor, and thus the higher the breakdown voltage of the transistor, the higher the drive voltage of the light emitting element 130 can be. In the image light generation device 10 of the present embodiment, in the three panels, the size of the first transistor constituting the pixel circuit of the first panel 11B that emits blue light is greater than the size of the second transistor constituting the pixel circuit of the second panel 11G that emits green light and the size of the third transistor constituting the pixel circuit of the third panel 11R that emits red light. In this manner, the breakdown voltage of the first transistor is greater than the breakdown voltage of the second transistor and the breakdown voltage of the third transistor.

As a result, in the present embodiment, a high drive voltage can be supplied to the pixel circuit of the first panel 11B, and thus the luminance of the first image light LB can be increased, and, the luminance of the composite image light LW can be increased.

On the other hand, the power consumption of each of the panels 11B, 11G and 11R is determined by the transistor breakdown voltage, i.e., the product of the input current and the drive voltage that can be applied to the light emitting element 130. Therefore, to reduce the power consumption as the image light generation device 10, it is preferable to use the light emitting element 130 having a high efficiency and a panel having a low transistor breakdown voltage as much as possible.

In view of this, in the image light generation device 10 of the present embodiment, a panel having a high transistor breakdown voltage is used only for the first panel 11B whereas a panel having a high transistor breakdown voltage is not used for the second panel 11G and the third panel 11R, and thus increase in the power consumption of the image light generation device 10 can be suppressed. In this manner, according to the present embodiment, it is possible to achieve the image light generation device 10 that can achieve image light with a high luminance and can suppress the increase in power consumption.

Here, in order to demonstrate the effect of the image light generation device 10 of the present embodiment, the present inventors conducted simulations of the maximum luminance of the image light and the power consumption for an example 1, and comparative examples 1 and 2 described below.

To be more specific, as an image light generation device of the example 1, the transistor breakdown voltage of the first panel (blue light panel) was set to 8 V, and the transistor breakdown voltage of the second panel (green light panel) and the third panel (red light panel) was set to 6 V. As an image light generation device of the comparative example 1, the transistor breakdown voltages of all of the first to third panels were set to 6 V. In addition, as an image light generation device of the comparative example 2, the transistor breakdown voltages of all of the first to third panels were set to 8 V.

Table 1 shows results of the simulations of the maximum luminance of the image light and the power consumption with the image light generation devices of the example 1 and the comparative example 1 and the comparative example 2. It is to be noted that the power consumption is indicated as a relative value with respect to the power consumption of the comparative example 1 set as 100, as the power consumption required for outputting image light of the same luminance.

TABLE 1

| | Tr Breakdown Voltage (V) | | | Maximum Luminance [cd/m$^2$] | Power Consumption (Relative Value) |
|---|---|---|---|---|---|
| | Red | Green | Blue | | |
| Example 1 | 6 | 6 | 8 | 54000 | 111 |
| Comparative Example 1 | 6 | 6 | 6 | 20000 | 100 |
| Comparative Example 2 | 8 | 8 | 8 | 54000 | 133 |

As shown in Table 1, in the case of the comparative example 1 where all of the transistor breakdown voltages were set to 6 V, the maximum luminance was 20000 cd/m$^2$, and high luminance was not obtained. In addition, in the case of the comparative example 2 where all of the transistor breakdown voltages were set to 8 V, the maximum luminance was 54000 cd/m$^2$, which is higher than that of the comparative example 1, but the power consumption was 133, which is larger than that of the comparative example 1. In contrast, in the case of the example 1 where only the transistor breakdown voltage of the first panel was ser to 8 V and the transistor breakdown voltages of the other panels were set to 6 V, the maximum luminance was 54000 cd/m$^2$, which is an improvement from the comparative example 1, and the power consumption was 111, which is a reduction from the comparative example 2. In this manner, it was demonstrated that according to the present embodiment, the maximum luminance of image light can be improved and the increase in the power consumption can be suppressed.

The reasons for the above results may be as follows.

In the case where a panel having a transistor breakdown voltage that matches the green light panel and the red light panel is used also for the blue light panel as in the comparative examples 1 and 2, the increase of the drive voltage is limited due to the influence of the voltage limitation at the blue light panel when generating white light by combining the light of the three colors, and consequently image light of a high luminance cannot be output. In view of this, as shown in the example 1, the voltage limitation of the blue light panel can be avoided by increasing the transistor breakdown voltage only in the blue light panel, and thus image light of a high luminance can be output. On the other hand, in the case where the same panel having a high transistor breakdown voltage as the blue light panel is used also in the red light panel and the green light panel, the power consumption for outputting a predetermined luminance increases, which is not preferable as an image light generation device.

Second Embodiment

A second embodiment of the present disclosure is described below with reference to FIG. 6.

The basic configuration of an image light generation device of the second embodiment is similar to that of the first embodiment, and the image light generation device of the second embodiment is different from that of the first embodiment in configuration of the light emitting element. Therefore, the description of the general configuration of the image light generation device will be omitted. FIG. 6 is a sectional view of a light emitting element of a first panel in the image light generation device of the present embodiment. In FIG. 6, the same components as those of FIG. 5 used in the first embodiment are denoted by the same reference numerals, and the description thereof is omitted.

In the image light generation device of the present embodiment, the first light emitting element 18B that constitutes the first panel has a tandem structure including a blue emission layer that emits blue light. The second light emitting element that constitutes the second panel that emits green light and the third light emitting element that constitutes the third panel that emits red light do not have a tandem structure. That is, the second light emitting element and the third light emitting element have the same configuration as that of the first light emitting element 17B of the first embodiment illustrated in FIG. 5.

Figure 6:
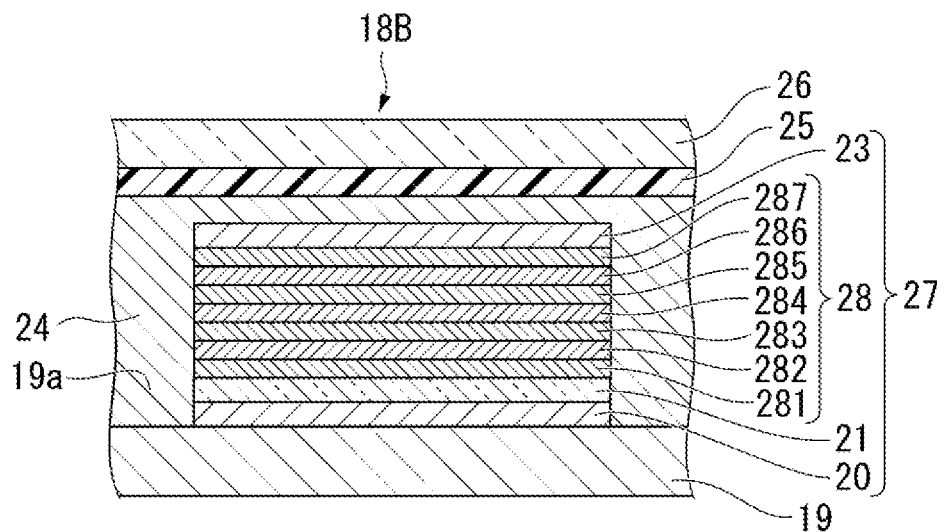
FIG. 6 is a sectional view illustrating a schematic configuration of a first light emitting element in an image light generation module of a second embodiment.

FIG. 6 is a sectional view illustrating a schematic configuration of the first light emitting element 18B.

As illustrated in FIG. 6, the first light emitting element 18B of the present embodiment includes the substrate 19, the reflection electrode 20, the anode 21, a light emission functional layer 28, the cathode 23, the sealing film 24, the color filter 25, and the cover glass 26. The light emission functional layer 28 is composed of a hole injection layer 281, a first blue emission layer 282 including an organic EL material, an electron transport layer 283, a charge generation layer (intermediate layer) 284 including lithium, a hole transport layer 285, a second blue emission layer 286 including an organic EL material, and an electron injection layer 287, which are stacked in this order from the anode 21 side.

The other configurations of the image light generation device are similar to those of the image light generation device of the first embodiment. Specifically, the size of the first transistor is greater than the size of the second transistor and the size of the third transistor. To be more specific, the source-drain distance of the first transistor is greater than the source-drain distance of the second transistor and the source-drain distance of the third transistor. Alternatively, the film thickness of the gate insulating film of the first transistor is greater than the film thickness of the gate insulating film of the second transistor and the film thickness of the gate insulating film of the third transistor.

Also in the present embodiment, it is possible to achieve the same effect as that of the first embodiment such as the achievement of an image light generation device that can obtain image light with a high luminance and can suppress the increase in power consumption.

In general, when a large current is input to an organic EL element, degradation of the luminance is disadvantageously facilitated. To solve such a problem, an organic EL element having a tandem structure that can improve the current efficiency has been proposed. However, an organic EL element having a tandem structure is substantially equivalent to a structure in which two light emitting elements are coupled in series, and as such the drive voltage is substantially twice that of a typical organic EL element, which is a significant increase. In view of this, it is effective to apply a high breakdown-voltage transistor only in the first panel that employs the first light emitting element 18B having a tandem structure as in the present embodiment.

It is to be noted that in the structure of the present embodiment, a transistor having a tandem structure is employed in a panel having a light emitting element that emits blue light, and the size of that transistor is larger than the size of a transistor of a panel including a light emitting element that emits color light other than blue light. In place of this configuration, a transistor having a tandem structure may be employed in a panel including a light emitting element that emits color light other than blue light, and the size of that transistor may be set to a value larger than the size of a transistor of a panel including a light emitting element that emits color light including blue light. Even in this case, the increase in the power consumption of the image light generation device can be suppressed by reducing the transistor breakdown voltage of a panel other than the panel including the transistor having the tandem structure that actually increases the drive voltage.

Third Embodiment

A third embodiment of the present disclosure is described below with reference to FIG. 7.

An image light generation device of the third embodiment has the same basic configuration as that of the first embodiment, and the image light generation device of the third embodiment is different from that of the first embodiment in configuration of the panel. Therefore, the description of the general configuration of the image light generation device will be omitted.

Figure 7:
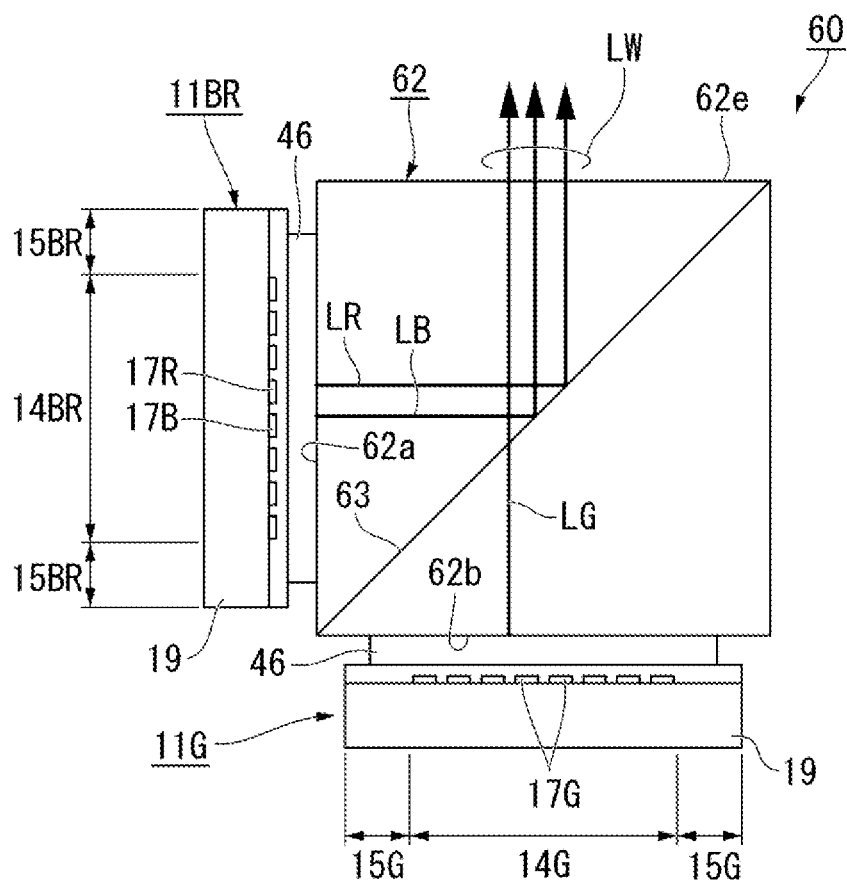
FIG. 7 is a diagram illustrating a schematic configuration of an image light generation module of a third embodiment.

FIG. 7 is a diagram illustrating a schematic configuration of the image light generation device of the present embodiment.

In FIG. 7, the same components as those of FIG. 1 used in the first embodiment are denoted by the same reference numerals, and the description thereof is omitted.

In an image light generation device 60 of the present embodiment, two self-emitting panels composed of organic EL panels are used as image light generation panels.

As illustrated in FIG. 7, the image light generation device 60 includes the first panel 11BR, the second panel 11G, and a dichroic prism 62 (color combining prism).

The first panel 11BR includes the first pixel region 14BR including a plurality of pixels disposed in a matrix, and the first non-pixel region 15BR that surrounds the periphery of first pixel region 14BR. The second panel 11G includes the second pixel region 14G including a plurality of pixels disposed in a matrix, and the second non-pixel region 15G that surrounds the periphery of the second pixel region 14G.

Of the plurality of pixels in the first panel 11BR, half of the pixels are provided with the first light emitting elements 17B, and the other half of the pixels are provided with the third light emitting elements 17R. That is, the first panel 11BR is provided with the first light emitting elements 17B and the third light emitting elements 17R. In addition, each of the plurality of pixels in the second panel 11G is provided with the second light emitting element 17G.

Each of the plurality of first light emitting elements 17B provided in the first panel 11BR emits the blue first image light LB. In addition, each of the plurality of third light emitting elements 17R provided in the first panel 11BR emits the red third image light LR. That is, the first panel 11BR emits the blue first image light LB and the red third image light LR. In addition, each of the plurality of second light emitting elements 17G provided in the second panel 11G emits the green second image light LG. Also in the present embodiment, each of the first light emitting element 17B, the second light emitting element 17G, and the third light emitting element 17R is composed of a top-emission organic EL element.

In the present embodiment, the size of the transistor of the first panel 11BR is greater than the size of the transistor of the second panel 11G. That is, the size of the first transistor constituting the pixel circuit that emits blue light and the size of the third transistor constituting the pixel circuit that emits red light are greater than the size of the second transistor constituting the pixel circuit that emits green light. To be more specific, the source-drain distance of the first transistor and the source-drain distance of the third transistor are greater than the source-drain distance of the second transistor. It is to be noted that the source-drain distance of the first transistor and the source-drain distance of the third transistor may be the same, or the source-drain distance of the first transistor may be greater.

Alternatively, the film thickness of the gate insulating film of the first transistor and the film thickness of the gate insulating film of the third transistor may be greater than the film thickness of the gate insulating film of the second transistor.

Alternatively, the relationship between the sizes of the transistors may include both the above-mentioned two configurations. Specifically, the source-drain distance of the first transistor and the source-drain distance of the third transistor may be greater than the source-drain distance of the second transistor, with the film thickness of the gate insulating film of the first transistor and the film thickness of the gate insulating film of the third transistor greater than the film thickness of the gate insulating film of the second transistor.

In the present embodiment, the dichroic prism 62 is composed of a combination of two triangular prismatic optically transparent members. The dichroic prism 62 includes a first incidence surface 62a, a second incidence surface 62b in perpendicular contact with the first incidence surface 62a, and an emission surface 62e opposite the second incidence surface 62b.

The dichroic prism 62 includes a dichroic mirror 63 that does not have a polarization separation property. The dichroic mirror 63 has a property of reflecting the first image light LB and the third image light LR, and transmitting the second image light LG.

The first panel 11BR is disposed opposite to the first incidence surface 62a. The second panel 11G is disposed opposite to the second incidence surface 62b. In the present embodiment, the first panel 11BR is fixed to the first incidence surface 62a through the optically transparent adhesive agent layer 46. The second panel 11G is fixed to the second incidence surface 62b through the optically transparent adhesive agent layer 46.

The image light generation device 60 of the present embodiment emits composite image light LW composed of a combination of the first image light LB, the second image light LG, and the third image light LR, from the emission surface 62e of the dichroic prism 62.

Also in the present embodiment, it is possible to achieve the same effect as that of the first embodiment such as the achievement of the image light generation device 60 that can obtain image light with a high luminance and can suppress the increase in power consumption.

Here, in order to demonstrate the effect of the image light generation device 60 of the present embodiment, the present inventors conducted simulations of the maximum luminance of the image light and the power consumption for an example 2 and comparative examples 3 and 4 described below.

To be more specific, as an image light generation device of the example 2, the transistor breakdown voltage of the first panel (blue light and red light panels) was set to 10 V, and the transistor breakdown voltage of the second panel (green light panel) was set to 6 V. In contrast, as an image light generation device of the comparative example 3, the transistor breakdown voltage of each of the first panel and the second panel was set to 6 V. In addition, as an image light generation device of the comparative example 4, the transistor breakdown voltage of each of the first panel and the second panel was set to 10 V.

Table 2 shows results of the simulations of the maximum luminance of the image light and the power consumption with the image light generation devices of the example 2 and the comparative examples 3 and 4. It is to be noted that the power consumption is indicated as a relative value with respect to the power consumption of the comparative example 3 set as 100, as the power consumption required for outputting image light of the same luminance.

TABLE 2

| | Tr Breakdown Voltage (V) | | Maximum Luminance | Power Consumption |
| --- | --- | --- | --- | --- |
| | Green | Red/Blue | [cd/m$^2$] | (Relative Value) |
| Example 2 | 6 | 10 | 32000 | 133 |
| Comparative Example 3 | 6 | 6 | 7000 | 100 |
| Comparative Example 4 | 10 | 10 | 32000 | 167 |

As shown in Table 2, in the case of the comparative example 3 where both transistor breakdown voltages were set to 6 V, the maximum luminance was 7000 cd/m$^2$, and high luminance was not obtained. In addition, in the comparative example 4 where both transistor breakdown voltages were set to 10 V, the maximum luminance was 32000 cd/m$^2$, which is an improvement from the comparative example 3, but the power consumption was 167, which is larger than that of the comparative example 3. In contrast, in the case of the example 2 where the transistor breakdown voltage of the first panel was set to 10 V and the transistor breakdown voltage of the second panel was set to 6 V, the maximum luminance was 32000 cd/m$^2$, which is an improvement from the comparative example 3, and the power consumption was 133, which is a reduction from the comparative example 4. In this manner, it was demonstrated that according to the present embodiment, the maximum luminance of image light can be improved, and the increase in the power consumption can be suppressed.

Fourth Embodiment

A fourth embodiment of the present disclosure is described below with reference to the drawings.

The image light generation device 10 described in the first embodiment is used for the image display device described below.

Figure 8:
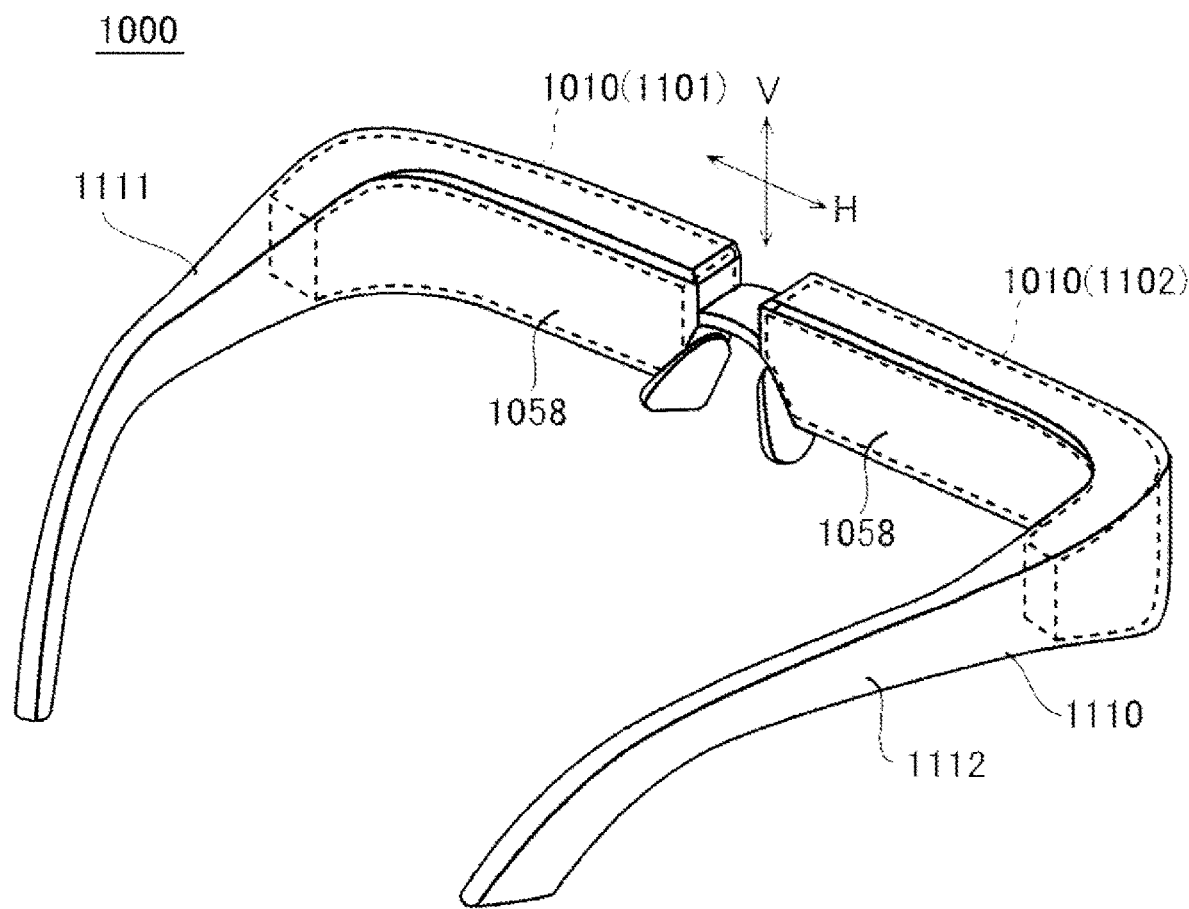
FIG. 8 is a diagram illustrating a schematic configuration of a head mounted display apparatus of the third embodiment.
Figure 9:
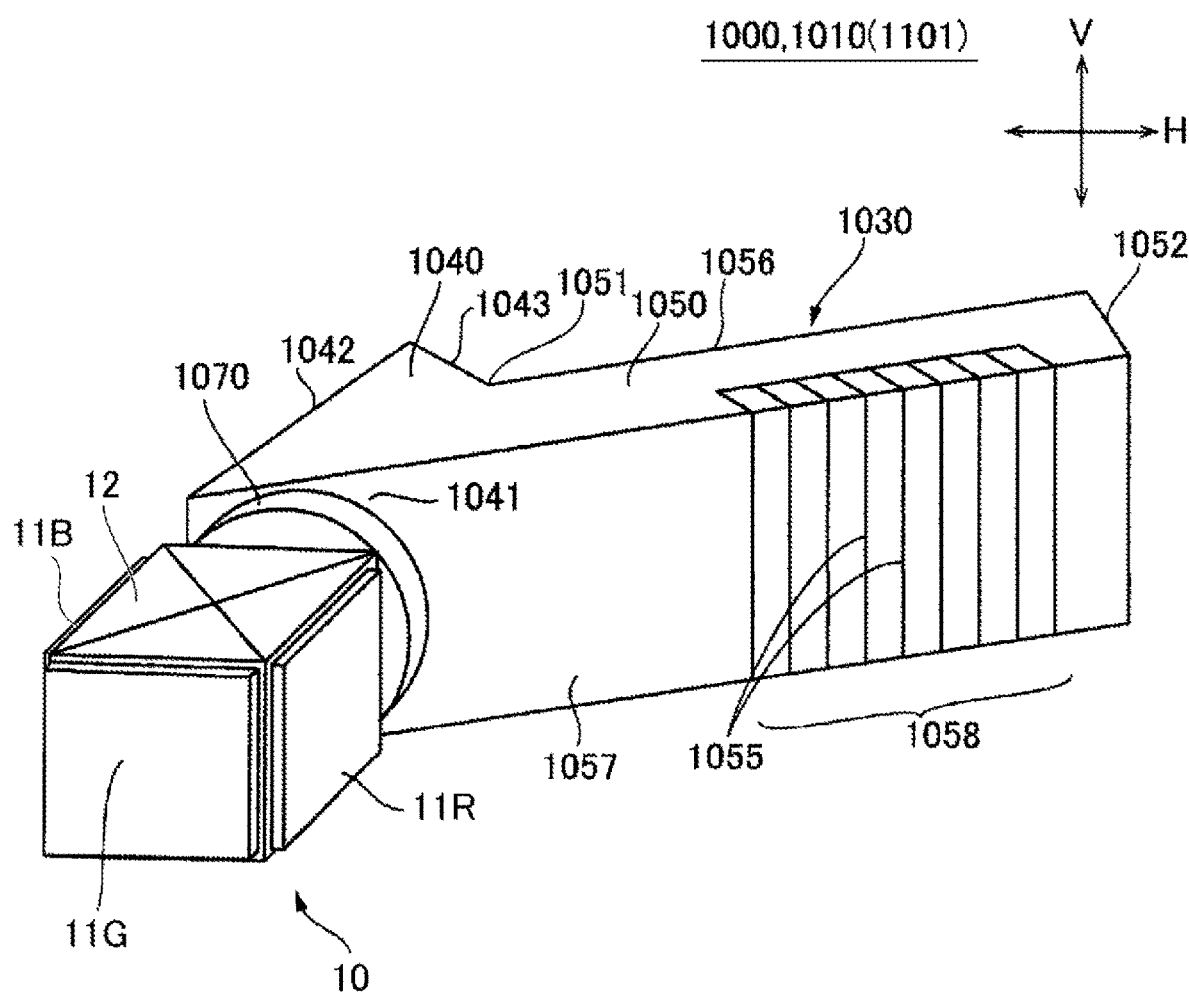
FIG. 9 is a perspective view schematically illustrating a configuration of an optical system of a virtual image display unit.
Figure 10:
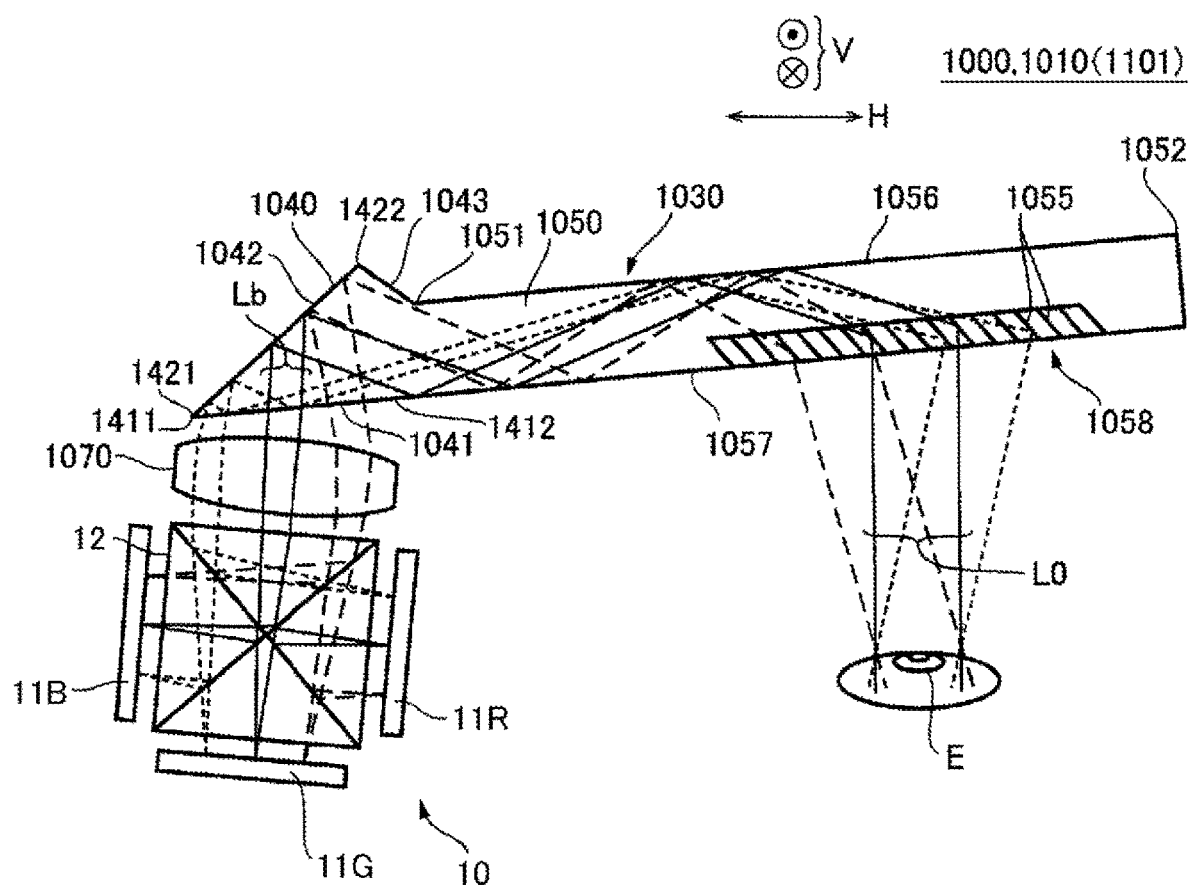
FIG. 10 is an explanatory diagram illustrating a light path of an optical system.

FIG. 8 is an explanatory diagram of a head mounted display apparatus 1000 of the fourth embodiment. FIG. 9 is a perspective view schematically illustrating a configuration of an optical system of a virtual image display unit 1010 illustrated in FIG. 8. FIG. 10 is an explanatory diagram illustrating light paths of an optical system illustrated in FIG. 9.

As illustrated in FIG. 8, the head mounted display apparatus 1000 (image display device) is configured as a see-through eyeglass-display, and includes a frame 1110 with temples 1111 and 1112 on the left and right sides. In the head mounted display apparatus 1000, the virtual image display unit 1010 is supported by the frame 1110 and is configured such that the user recognizes an image emitted from the virtual image display unit 1010 as a virtual image. In the present embodiment, the head mounted display apparatus 1000 includes, as the virtual image display unit 1010, a left ophthalmic display unit 1101 and a right ophthalmic display unit 1102. In the present embodiment, the head mounted display apparatus 1000 includes, as the virtual image display unit 1010, a left ophthalmic display unit 1101 and a right ophthalmic display unit 1102.

In the following description, the left ophthalmic display unit 1101 is mainly described, and the description of the right ophthalmic display unit 1102 will be omitted.

As illustrated in FIG. 9 and FIG. 10, in the head mounted display apparatus 1000, the left ophthalmic display unit 1101 includes the image light generation device 10, and a light guiding system 1030 that guides composite image light LW emitted from the image light generation device 10 to an emission part 1058. A projection lens system 1070 is disposed between the image light generation device 10 and the light guiding system 1030. The composite image light LW emitted from the image light generation device 10 impinges on the light guiding system 1030 through the projection lens system 1070. The projection lens system 1070 is composed of one collimator lens having a positive power.

The image light generation device 10 includes the dichroic prism 12, and three panels, 11B, 11G and 11R, provided opposite to three surfaces of four surfaces (the third surfaces of the triangular prisms) of the dichroic prism 12. The panels 11B, 11G and 11R are composed of organic EL panels, for example.

The image light emitted from the first panel 11B impinges on the dichroic prism 12 as the first image light LB of a first wavelength region. The image light emitted from the second panel 11G impinges on the dichroic prism 12 as the second image light LG of a second wavelength region. The image light emitted from the third panel 11R impinges on the dichroic prism 12 as the third image light LR of third wavelength region. Composite image light LW composed of a combination of the first image light LB, the second image light LG and the third image light LR is emitted from the dichroic prism 12.

The light guiding system 1030 includes an optically transparent incident part 1040 on which the composite image light LW impinges, and an optically transparent light guiding part 1050 with one end 1051 side coupled with an incident part 1040. In the present embodiment, the incident part 1040 and the light guiding part 1050 are composed of an optically transparent unitary member.

The incident part 1040 includes an incidence surface 1041 on which the composite image light LW emitted from the image light generation device 10 impinges, and a reflecting surface 1042 that reflects the composite image light LW entered from the incidence surface 1041 between it and the incidence surface 1041. The incidence surface 1041 is composed of a flat surface, an aspherical surface, a free curved surface or the like, and is opposite to the image light generation device 10 through the projection lens system 1070. The projection lens system 1070 is obliquely disposed such that the distance to an end portion 1412 of the incidence surface 1041 is larger than the distance to an end portion 1411 of the incidence surface 1041.

No reflection film is formed on the incidence surface 1041, but it totally reflects light incident at an incident angle equal to or greater than a critical angle. That is, the incidence surface 1041 has a light transparency and a light reflecting property. The reflecting surface 1042 is composed of a surface that is opposite to the incidence surface 1041, and is obliquely disposed such that an end portion 1422 is distant from the incidence surface 1041 than an end portion 1421 of the incidence surface 1041. That is, the incident part 1040 has a substantially triangular shape. The reflecting surface 1042 is composed of a flat surface, an aspherical surface, a free curved surface, or the like. The reflecting surface 1042 has a configuration in which a reflective metal layer mainly composed of aluminum, silver, magnesium, chromium or the like is formed.

The light guiding part 1050 includes a first surface 1056 (first reflecting surface) extending from the one end 1051 to another end 1052 side, a second surface 1057 (second reflecting surface) disposed opposite and parallel to the first surface 1056 and extending from the one end 1051 side to the other end 1052 side, and the emission part 1058 provided in a portion distant from the incident part 1040 in the second surface 1057. The first surface 1056 and the reflecting surface 1042 of the incident part 1040 are contiguous with each other with a tilted surface 1043 therebetween. The thicknesses of the first surface 1056 and the second surface 1057 are smaller than that of the incident part 1040. The first surface 1056 and the second surface 1057 totally reflect incident light at an incident angle equal to or greater than a critical angle on the basis of the refractive index difference between the light guiding part 1050 and the outside (air). In view of this, no reflection film is formed in the first surface 1056 and the second surface 1057.

The emission part 1058 is configured in a part on the second surface 1057 side in the thickness direction of the light guiding part 1050. In the emission part 1058, a plurality of partial reflecting surfaces 1055 tilted with respect to the normal to the second surface 1057 is disposed parallel to each other. The emission part 1058 is a portion overlapping the plurality of partial reflecting surfaces 1055 in the second surface 1057, and is a region with a predetermined width in the extending direction of the light guiding part 1050. Each of the plurality of partial reflecting surfaces 1055 is composed of a dielectric multilayer film. In addition, at least one of the plurality of partial reflecting surfaces 1055 may be a composite layer of a dielectric multilayer film, and a reflective metal layer (thin film) mainly composed of aluminum, silver, magnesium, chromium and the like. In the case where the partial reflecting surface 1055 includes a metal layer, it is possible to achieve an effect of increasing the reflectance of the partial reflecting surface 1055, or an effect of optimizing the incident angle dependence and the polarization dependence of the transmittance and the reflectance of the partial reflecting surface 1055. It is to be noted that the emission part 1058 may have a configuration in which an optical device such as a diffraction grating and a hologram is provided.

In the head mounted display apparatus 1000 having the above-mentioned configuration, the composite image light LW of parallel light entered from the incident part 1040 is refracted at the incidence surface 1041 toward the reflecting surface 1042. Next, the composite image light LW is reflected at the reflecting surface 1042 toward the incidence surface 1041 again. Then, the composite image light LW impinges on the incidence surface 1041 at an incident angle equal to or greater than a critical angle, and is therefore reflected at the incidence surface 1041 toward the light guiding part 1050 so as to travel toward the light guiding part 1050. While the incident part 1040 is configured such that the composite image light LW composed of parallel light impinges on the incidence surface 1041, it is also possible to adopt a configuration in which the incidence surface 1041 and the reflecting surface 1042 are composed of free curved surfaces and the like such that after the composite image light LW composed of non-parallel light is converted to parallel light while the composite image light LW incident on the incidence surface 1041 is reflected between the reflecting surface 1042 and the incidence surface 1041.

In the light guiding part 1050, the composite image light LW travels while being reflected between the first surface 1056 and the second surface 1057. A part of the composite image light LW incident on the partial reflecting surface 1055 is reflected at the partial reflecting surface 1055 and emitted from the emission part 1058 toward a viewer's eye E. In addition, the other part of the composite image light LW incident on the partial reflecting surface 1055 passes through the partial reflecting surface 1055 and impinges on the next partial reflecting surface 1055 adjacent thereto. In this manner, the composite image light LW reflected at each of the plurality of partial reflecting surfaces 1055 is emitted from the emission part 1058 toward the viewer's eye E. In this manner, the viewer can recognize a virtual image.

Then, the light that impinges on the light guiding part 1050 from the outside passes through the partial reflecting surface 1055 and reaches the viewer's eye E, after impinging on the light guiding part 1050. Thus, the viewer can visually recognize a color image emitted from the image light generation device 10, and can visually recognize the outside scenery and the like in a see-through manner.

The head mounted display apparatus 1000 of the fourth embodiment includes the image light generation device 10 of the first embodiment, and therefore can display a bright image and can reduce the power consumption. It is to be noted that the head mounted display apparatus 1000 may include the image light generation device of the second embodiment or the image light generation device of the third embodiment.

While the head mounted display apparatus 1000 of the fourth embodiment uses the light guiding part 1050 as the light guiding system 1030, it is also possible to configure a head mounted display apparatus by applying the image light generation device 10 of the first embodiment to an optical system using no light guiding part.

Fifth Embodiment

A fifth embodiment of the present disclosure is described below with reference to FIG. 11.

The image light generation device 10 described in the first embodiment is used for a display device described below.

Figure 11:
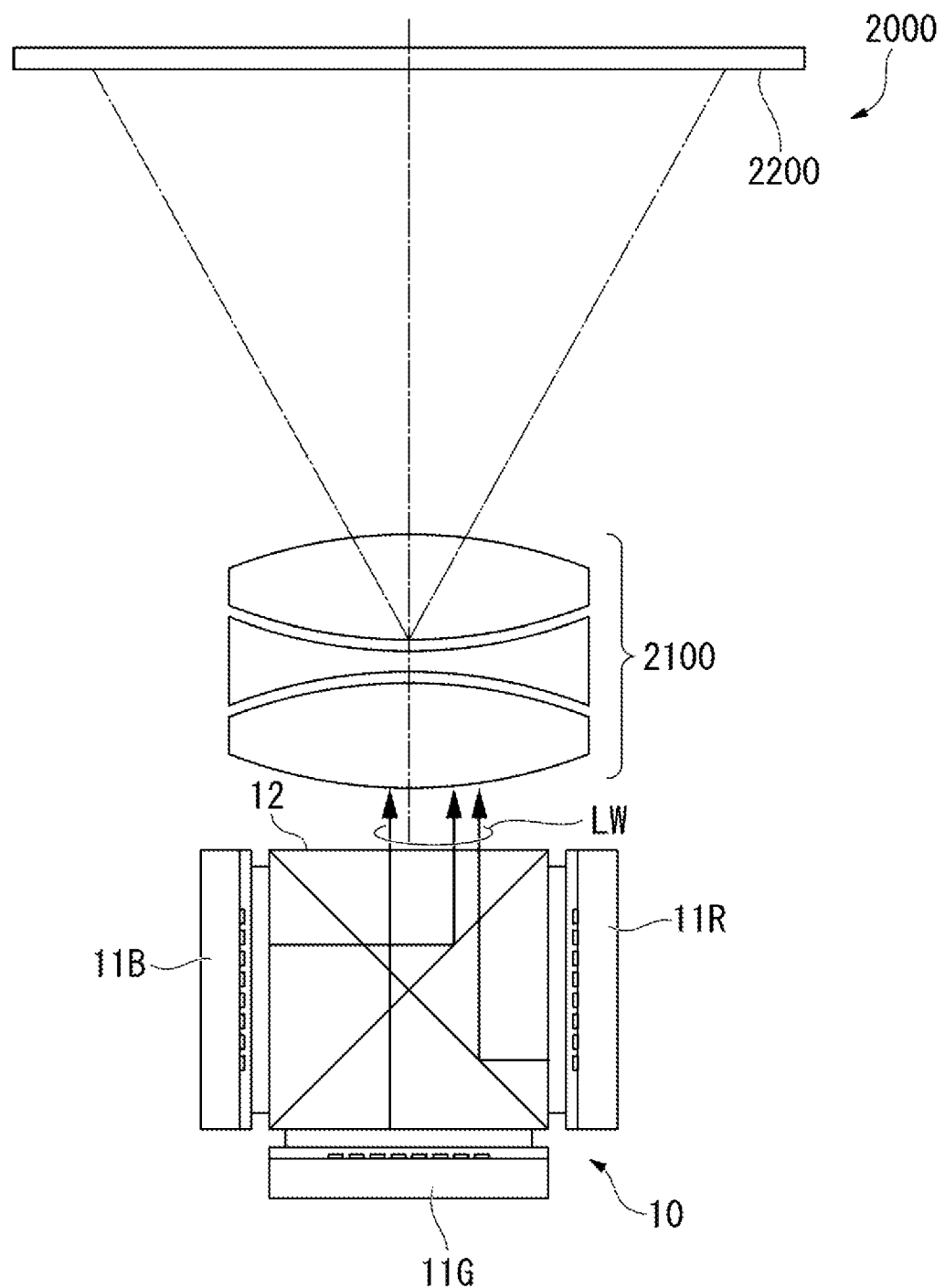
FIG. 11 is a diagram illustrating a schematic configuration of a projection-type display device of a fourth embodiment.

FIG. 11 is a diagram illustrating a schematic configuration of a projection-type display device 2000 of the fifth embodiment.

As illustrated in FIG. 11, the projection-type display device 2000 (image display device) includes the image light generation device 10 according to the embodiment, and a projection optical system 2100 that projects the composite image light LW emitted from the image light generation device 10 onto a projection target member 2200 such as a screen in an enlarged manner.

The image light generation device 10 includes the dichroic prism 12, and three panels, 11B, 11G and 11R, provided opposite to three surfaces of four surfaces (the third surfaces of the triangular prisms) of the dichroic prism 12. The panels 11B, 11G and 11R are composed of panels, such as an organic EL panels, that emit image light that does not have polarization properties, for example.

The projection-type display device 2000 of the fifth embodiment includes the image light generation device 10 of the first embodiment, and thus can display bright image and can reduce the power consumption.

Note that the technical scope of the present disclosure is not limited to the above-described embodiment, and various modifications can be made to the above-described exemplary embodiment without departing from the spirit and gist of the present disclosure.

For example, the above-described embodiments satisfy the relationship in which the size of the first transistor is greater than the size of the second transistor and the size of the third transistor when all transistors of the same positions are compared with each other in a plurality of transistors constituting one pixel circuit. It should be noted that an aspect of the present disclosure is not limited to the above-mentioned configuration, and may satisfy a relationship in which the size of the first transistor is greater than the size of the second transistor and the size of the third transistor when transistors at least at one position are compared with each other in a plurality of transistors constituting the pixel circuit.

In addition, while in the above-described embodiments, the first panel, the second panel and the third panel that constitute the image light generation device are organic EL panels, the panels may not be limited to organic EL panels, and self-luminous panels such as inorganic EL panels and micro LED panels may be used.

In addition, other examples of the image display device including the image light generation module described in the embodiment include a head-up display (HUD), a hand-held display (HHD), and an electronic view finder (EVF) used in an image pickup device such as a video camcorder and a still camera.

Other specific descriptions regarding the number, shape, arrangement, constituent materials, and the like of each of the components of the image light generation device of the embodiments can be changed as appropriate, not limited to the above embodiment.

The image light generation device of one aspect of the present embodiment may have the following configurations.

An image light generation device according to an aspect of the present embodiment includes a first panel configured to emit a first image light of blue, a second panel configured to emit a second image light of a color other than blue, and a color combining prism configured to combine the first image light and the second image light. The first panel includes a plurality of first pixels, each of the plurality of first pixels includes a first light emitting element configured to emit blue light, and a first transistor configured to drive the first light emitting element, the second panel includes a plurality of second pixels, each of the plurality of second pixels includes a second light emitting element configured to emit color light other than the blue light, and a second transistor configured to drive the second light emitting element, and a size of the first transistor is greater than a size of the second transistor.

In the image light generation device according to an aspect of the present embodiment, a source-drain distance of the first transistor may be greater than a source-drain distance of the second transistor.

In the image light generation device according to an aspect of the present embodiment, a film thickness of a gate insulating film of the first transistor may be greater than a film thickness of a gate insulating film of the second transistor.

An image light generation device according to an aspect of the present embodiment includes a first panel configured to emit a first image light of a first color, a second panel configured to emit a second image light including a wavelength region different from the first color, and a color combining prism configured to combine the first image light and the second image light. The first panel includes a plurality of first pixels, each of the plurality of first pixels includes a first light emitting element configured to emit color light of the first color, and a first transistor configured to drive the first light emitting element, the first light emitting element includes a tandem structure including a light emitting layer, the second panel includes a plurality of second pixels, each of the plurality of second pixels includes a second light emitting element configured to emit color light of a color other the first color, and a second transistor configured to drive the second light emitting element, and a size of the first transistor is greater than a size of the second transistor.

In the image light generation device according to an aspect of the present embodiment, a source-drain distance of the first transistor may be greater than a source-drain distance of the second transistor.

In the image light generation device according to an aspect of the present embodiment, a film thickness of a gate insulating film of the first transistor may be greater than a film thickness of a gate insulating film of the second transistor.

In the image light generation device according to an aspect of the present embodiment, the first color may be blue.

An image display device according to an aspect of the present embodiment includes the image light generation device according to the aspect of the present embodiment.

What is claimed is:

1. An image light generation device comprising:
   a first panel configured to emit a first image light including a blue wavelength region;
   a second panel configured to emit a second image light including a wavelength region different from the blue wavelength region; and
   a color combining prism configured to combine the first image light and the second image light, wherein
   the first panel includes a plurality of first pixels,
   each of the plurality of first pixels includes a first light emitting element configured to emit color light including the blue wavelength region, and a first transistor provided corresponding to the first light emitting element,
   the second panel includes a plurality of second pixels,
   each of the plurality of second pixels includes a second light emitting element configured to emit color light including the wavelength region different from the blue wavelength region, and a second transistor provided corresponding to the second light emitting element, and
   a size of the first transistor is greater than a size of the second transistor.

2. The image light generation device according to claim 1, wherein a source-drain distance of the first transistor is greater than a source-drain distance of the second transistor.

3. The image light generation device according to claim 1, wherein a film thickness of a gate insulating film of the first transistor is greater than a film thickness of a gate insulating film of the second transistor.

4. An image light generation device comprising:
   a first panel configured to emit a first image light including a first wavelength region;
   a second panel configured to emit a second image light including a wavelength region different from the first wavelength region; and
   a color combining prism configured to combine the first image light and the second image light, wherein
   the first panel includes a plurality of first pixels, each of the plurality of first pixels includes a first light emitting element configured to emit color light including the first wavelength region, and a first transistor provided corresponding to the first light emitting element, the first light emitting element has a tandem structure including a light emitting layer, the second panel includes a plurality of second pixels, each of the plurality of second pixels includes a second light emitting element configured to emit color light including the wavelength region different from the first wavelength region, and a second transistor provided corresponding to the second light emitting element, and a size of the first transistor is greater than a size of the second transistor.

5. The image light generation device according to claim 4, wherein a source-drain distance of the first transistor is greater than a source-drain distance of the second transistor.

6. The image light generation device according to claim 4, wherein a film thickness of a gate insulating film of the first transistor is greater than a film thickness of a gate insulating film of the second transistor.

7. The image light generation device according to claim 4, wherein color of the first wavelength region is blue.

8. An image display device comprising the image light generation device according to claim 1.

9. An image display device comprising the image light generation device according to claim 4.

* * * * *